US006421634B1

United States Patent
Dearth et al.

(10) Patent No.: US 6,421,634 B1
(45) Date of Patent: Jul. 16, 2002

(54) INTERFACE INDEPENDENT TEST SYSTEM

(75) Inventors: Glenn A. Dearth, Groton; George R. Plouffe, Jr., Bradford; David M. Kaffine, North Billerica; Janet Y. Zheng, Andover, all of MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/262,575

(22) Filed: Mar. 4, 1999

(51) Int. Cl.[7] .............................................. G06F 9/455
(52) U.S. Cl. .............................. 703/14; 703/20; 714/26; 714/33; 714/38
(58) Field of Search ............................. 703/13, 14, 16, 703/20; 714/26, 38, 45, 46, 33; 706/53

(56) References Cited

U.S. PATENT DOCUMENTS

| | | | |
|---|---|---|---|
| 5,732,247 A | 3/1998 | Dearth et al. | 395/500 |
| 5,751,941 A | 5/1998 | Hinds et al. | 395/183.14 |
| 5,848,236 A | 12/1998 | Dearth et al. | 395/183.09 |
| 6,002,869 A * | 12/1999 | Hinckley | 395/704 |
| 6,067,639 A * | 5/2000 | Rodrigues et al. | 714/38 |
| 6,219,802 B1 * | 4/2001 | Beckeer et al. | 714/32 |
| 6,233,540 B1 * | 5/2001 | Schaumont et al. | 703/14 |

OTHER PUBLICATIONS

Dearth et al., "Networked Object Oriented Verification with C++ and Verilog," ©1998 IEEE, pp. 158–164.
Patent Abstracts of Japan, publication No. 07254008, published Oct. 3, 1995.
Patent Abstracts of Japan, publication No. 10326835, published Dec. 8, 1998.
Patent Abstracts of Japan, publication No. 10049560, published Feb. 20, 1998.
Patent Abstracts of Japan, publication No. 10340283, published Dec. 22, 1998.
Search Report for International Application No. PCT/US 00/05444, mailed Oct. 19, 2000.

* cited by examiner

*Primary Examiner*—Russell Frejd
*Assistant Examiner*—T. Phan
(74) *Attorney, Agent, or Firm*—Conley, Rose & Tayon, PC; B. Noël Kivlin

(57) ABSTRACT

A system and method for circuitry design verification testing using a structure of interface independent classes to provide for rapid prototyping and design modification while maximizing test code re-use. A circuit simulation subsystem is interfaced with a test subsystem. The test subsystem employs a system transaction class for collecting common routines and pointers to device transactions. One or more configuration transaction classes derived from the system transaction class define transactions between functional models within the simulation subsystem and cause instantiation of the respective functional models. Operations are performed on the functional models via pointers to interface independent transaction classes which define interfaces to the devices. The operations are mapped to the current designs of the functional models by subclasses of the interface independent transaction classes. Changes to the functional model designs necessitate changes to the subclasses, but the interface independent transaction classes maintain a consistent interface and allow the test code to be re-used with minimal changes.

18 Claims, 3 Drawing Sheets

INTERFACE INDEPENDENT TEST SYSTEM

BACKGROUND OF THE INVENTION

1. Field of the Invention

The present invention relates generally to computer systems and more particularly to methods and apparatus for facilitating the testing and verification of integrated circuit designs using simulation tools.

2. Description of the Relevant Art

Because of the complexity of the circuitry in modern integrated circuits (ICs), the design of the circuitry is thoroughly tested before the actual circuit is manufactured. The testing is intended to identify errors in the design of the circuitry so that the errors can be corrected with minimal effort and expense. Typically, this testing is accomplished by simulating the functioning of the circuitry on a computer system using a hardware description language. (References herein to "HDL" will indicate a hardware reference language which may be Verilog or any other hardware description language.) The design engineers use an HDL to generate a detailed functional description of the circuitry including, for example, the input signals to be provided to the circuitry and the output signals which are produced in response thereto. The description of the circuitry may comprise descriptions of sub-components or "cells" and the interrelationships between these components. The resulting model can be used to simulate the behavior of the circuitry.

The HDL model of the circuitry is implemented in a simulation system to verify the proper functioning of the circuitry. The simulation system may comprise any one of a number of such systems, one example being the Verilog system, which is well known to those in the art. "Verilog" also refers to a particular HDL. The simulation system accepts data which defines the behavior of the circuitry as well as the signals to be input to the circuitry and, in response, generates data corresponding to simulated output signals.

Traditionally, the entire simulation system, including the functional description of the newly designed circuitry, has been written in HDL. Because HDL is used to form a detailed functional description of circuitry such as ASICs (Application-Specific Integrated Circuits), it is by nature a specialized and complex language. With the increasing complexity of these circuits, verification of functionality at the gate level is often insufficient because of the difficulty of observing the internal state of the circuitry at its I/O interface. Further, generating a set of tests for this circuitry can be a daunting task since HDL does not have many of the features which are found in higher-level languages and which make it easier for programmers to handle large software projects. It is therefore desirable to have an interface mechanism which allows tests written in higher-level languages to control a simulation written in HDL.

In addition to the testing difficulties resulting from the increased complexity of current ASICs, difficulties may arise from circuit designers' attempts to leverage intellectual property rights by integrating proprietary cores into their ASICs. These proprietary cores may themselves be very complex. Consequently, their operation generally needs to be verified in a stand-alone environment. Tests for these ASICs are therefore normally written specifically for the proprietary core in a stand-alone configuration. Usually, the tests are dependent upon the specific interface through which the core is driven during test. As a result, the tests cannot be reused once the proprietary core has been integrated into a larger ASIC. New tests must therefore be written to verify the operation of the integrated proprietary core, reducing the amount of time saved by using the already designed core.

Typically, the requirement of testing a proprietary core using several different interfaces is addressed by writing a different test procedure for each of the different interfaces. Each of these test procedures is given the same name, but is compiled separately and is saved in a separate library module. When a test application is linked, it is linked with the library module corresponding to the desired interface. This is, however, an awkward and error-prone process. The test writer must be able to identify and select the appropriate library from the multiple copies which must be maintained for the different interfaces. Even if the number of libraries is small, a mistake in choosing the correct library will introduce errors which may be difficult to identify and time-consuming to correct. This approach is also somewhat inconvenient because it is difficult to dynamically change the interface or to allow the use of several interfaces within the same test.

It would be helpful to be able to resolve this problem at compile time. One approach would be to use preprocessor directives to select the appropriate interface when the test application is compiled. Another approach would be to use function pointers to select the tests appropriate to a particular interface. Both of these approaches, however, are prone to error and result in code which is difficult to maintain.

It would be useful to be able to write tests in a manner which is independent of the interface to the circuit and which do not rely on the approaches suggested above. Interface independent tests could be written once to verify a particular sub-chip level functionality and then reused to test this functionality in the integrated ASIC. Although some tests (e.g. tests of the interface itself) cannot be written in an interface independent manner, many tests can be written this way. A generalized technique for writing interface independent tests would therefore be very beneficial and could provide considerable savings in the time required to test an ASIC. It would be useful to develop a class structure which would allow test writers to develop test code which is portable between several different ASIC interfaces without having to make substantial changes to the code.

Some of the problems facing test writers have been alleviated by the development of interface systems which allow tests to be written in high-level languages such as C and C++ instead of writing the entire simulation/test system in HDL. One such interface system is called CVI. The basis for CVI is described in U.S. Pat. No. 5,732,247 to Dearth, et al. CVI serves as an interface between a Verilog HDL simulation system and test system which is written in C++. CVI translates the C++ test statements into simulated bus activity in the simulation system. CVI is particularly useful in the development of simulation systems because the verification engineers who write the test procedures normally are not the same engineers who write the functional description of the new circuitry.

One important aspect of the CVI mechanism is that it allows the design of device objects which present a low-level register interface to the test writer. This is useful because it presents the test writer with a consistent interface style shared by all transactors and provides a consistent documentation format. ("Transactor" as used herein refers to a mechanism for executing a transaction, such as an implementation of a class or object as described in more detail below.) The low-level register interface is also intuitively appealing because the register model mimics modem computer system operation and is well understood by programmers. The CVI mechanism introduces a device driver abstraction which shields users from the low-level details of complex circuitry. This level of abstraction again provides test writers with a consistent view of many similar devices. The device drivers in the simulation system maintain state information regarding the devices in order to simplify control and scheduling of the operations of the device.

SUMMARY OF THE INVENTION

The issues surrounding the abstractions outlined above may be solved by various embodiments of the system and method of the present invention. One embodiment of the invention comprises a simulation system configured to model a circuit design and a test system configured to operate in cooperation with the simulation system. The systems comprise one or more software applications which may be stored on computer-readable media such as magnetic disks or tape, and which may be executed on a suitable computer system.

In one embodiment, a mechanism is provided to facilitate testing of both prototyped and finalized circuitry designs in a device simulation environment. The mechanism is implemented in a test system written in a high-level programming language. The test system is used in conjunction with a simulation system, which is written in an HDL, and a simulation system interface. The mechanism simplifies test writing by performing a function similar to that of an operating system device driver and abstracting away details of the device's operation which are needed by the test writer. The mechanism allows portions of the circuit design to be prototyped and later replaced with finalized designs, while at the same time allowing most of the test code to be retained. The mechanism may provide consistent high-level interfaces to device objects, device object information hiding, simplification of random environment testing, effective parallel operation without threading, state driven test writing style, encapsulation/aggregation of convenience routines, simplification of device object configuration management and storage of parameters for convenience routines in class member variables.

One embodiment of the invention comprises a hierarchical set of transaction classes. The uppermost class defines a base transaction. All transaction classes inherit from this class. Below the base transaction class are a device transaction class, an interface independent device transaction class and a system transaction class. The device transaction class is associated with a device through an object reference. The interface independent device transaction class is associated with a device transaction class through a subclass of the interface independent device transaction class which contains a pointer to the device transaction class. The system transaction class is used to collect convenience routines. The system transaction class contains pointers to each of the required device transaction classes or interface independent device transaction classes. The next level in the hierarchy includes one or more configuration transaction classes which reference selected device objects.

The system transaction class provides an infrastructure upon which the test writer can build the test code. The system transaction class contains pointers to device transactions for all of the devices in the simulated system and aggregates the convenience routines which may be useful in writing the tests. The system transaction class contains pointers to interface independent device transaction classes for those devices which may be subject to design changes. The system transaction class is not instantiated directly, but is instead used as the basis for the configuration transaction classes. Each configuration transaction class represents a selected subset of the devices in the simulated system and is instantiated to test transactions involving the corresponding devices. Because the configuration transaction classes use object references to the device objects, the user is forced to supply the appropriate device objects at the time of instantiation and the compiler is therefore able to perform static type checking. The configuration transaction classes thus enable the test writer to use all of the convenience routines defined in the system transaction class while only instantiating those device objects which are needed for the corresponding configuration. At the same time, the test writer can more easily maintain the test code because all of the convenience routines are written only once and collected in the system transaction class.

The system transaction class contains pointers to the interface independent device transaction classes. Because the devices are accessed through the interface independent device transaction classes, the test code is presented with a common interface to the devices. The subclasses derived from an interface independent device transaction class allow the tests to interface with the different configurations of a particular device. The same test code can therefore be used for the different device configurations.

BRIEF DESCRIPTION OF THE DRAWINGS

Other objects and advantages of the invention will become apparent upon reading the following detailed description and upon reference to the accompanying drawings in which.

Figure 1:
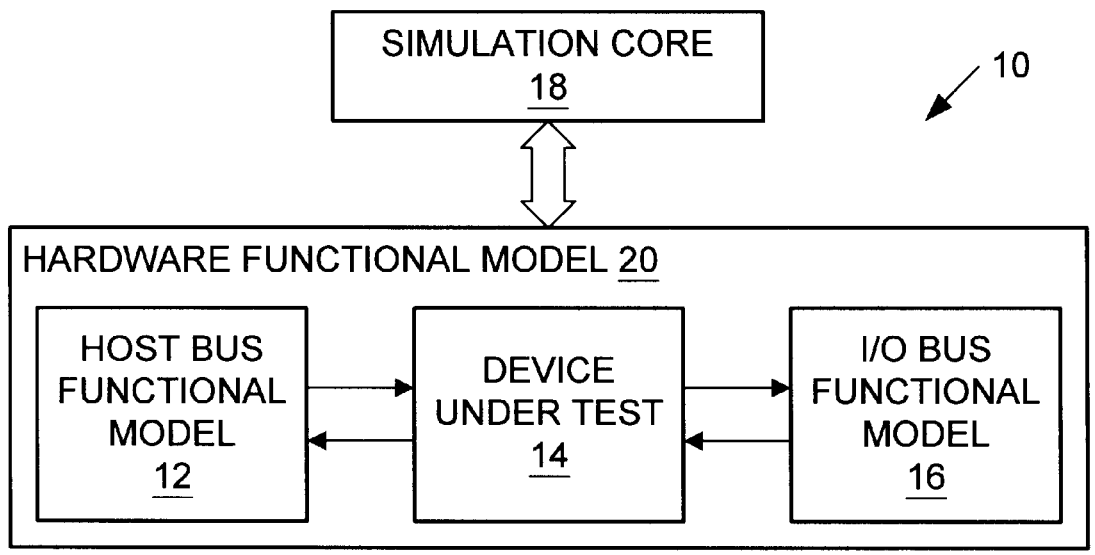
FIG. 1 is a functional diagram of a simple simulation system in one embodiment of the invention.

While the invention is subject to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

One embodiment of the invention is described below. In this embodiment, a set of transaction classes is implemented in the test subsystem of a circuit design verification system. The test system comprises one or more tests written in a high-level language. In this instance, the high-level language is C++. In other embodiments, a different high-level language can be used. The test system is used in conjunction with a simulation system which is written in a lower-level language such as the Verilog HDL. The test system and the simulation system are coupled by an interface such as CVI.

In other embodiments, different HDL's and interface systems can be used.

The transaction classes provide a mechanism through which a programmer can easily test selected functions in a circuit design. The classes form a hierarchy, the top of which is a base transaction class. The base transaction class contains several virtual functions which are used to initialize device objects and enable the device objects to handle signals and drive transactions during testing. A device transaction class is derived from the base transaction class and is used to provide a level of abstraction between the test writer and the device objects. A system transaction class is derived from the base transaction class and is used to provide an abstracted model of the circuit design under test. The system transaction class contains pointers to device transaction classes corresponding to device objects in the design under test. A configuration transaction class is derived from the system transaction class and is used to configure and test selected portions of the circuit design model. Both the device transaction class and the configuration transaction class contain references to device objects and, in fact, the configuration transaction class sets up device transactions for device objects to be used for executing tests.

It should be noted that, while the embodiment described here refers to a structure of interrelated classes, the invention contemplates a structure of interrelated objects as well. As will be appreciated by persons skilled in the art of the invention, objects are instantiations of classes. The distinction between classes and objects may therefore be viewed as one of code implementation versus memory implementation, or of source code versus executable code. Persons skilled in the art will appreciate these distinctions as well as the fact that the invention need not be limited to one or the other. Accordingly, the references herein to classes are intended to encompass objects which are instantiated from the classes. Likewise, references to objects are, for the purposes of this description, intended to encompass the classes from which they are instantiated.

The design verification system is designed to be implemented in a general-purpose computer system. The design verification system comprises a set of software applications which model the functions of a circuit design and perform a series of tests to verify these functions. It should be noted that, in alternate embodiments, one or more parts of the system can be implemented in hardware designed specifically for that purpose. The design verification system includes a test subsystem, a hardware simulation system and an interface subsystem.

The hardware simulation system is a software application which includes functional descriptions of the hardware to be simulated, including the newly designed circuitry. The hardware simulation system is used to model the operation of the hardware. The simulation system is typically written in a computer language specifically designed for that purpose (i.e., an HDL). In this instance, the simulation system is written in Verilog.

The hardware simulation system includes a number of functional models representative of portions of the system being modeled. These functional models will be referred to herein as bus functional models, although it should be noted that the portions of the system being modeled may comprise items other than buses. In addition to the bus functional models, the simulation system includes a functional model of the newly designed circuitry (i.e. the design under test, or device under test).

Referring to FIG. 1, a functional diagram of a simple simulation system 10 is shown. The simulation system 10 includes a simulation core 18 and a hardware functional model 20. The hardware functional model 20 includes a host bus functional model 12 and an I/O bus functional model 16 which represent the behavior of the model's interfaces. The functional model of the design under test 14 is inserted into the system and is operatively coupled to the host and I/O bus functional models 12 and 16, just as the hardware device would be coupled to the hardware buses. In operation, the host bus functional model 12 would provide a signal as a stimulus to the design under test 14, which would then respond to this stimulus. The stimulus consists of a set of signals which may correspond to a function call or some other command to the design under test. The design under test 14 may in turn convey one or more signals to the I/O bus functional model 16. The I/O bus functional model 16 would then convey a responsive signal to the design under test 14, which would subsequently convey a signal to the host bus functional model 12 so that the proper operation of the system could be verified for he corresponding function.

A portion of the bus functional models and the design under test are written in HDL. These functional models interact on a chip I/O level. That is, the models operate on individual bits or signals in the same way the physical devices which they represent operate on individual bits or signals which are input to the respective devices. The models and the corresponding designs can therefore be examined with a very high level of detail.

This level of detail, however, is very difficult to work with when a programmer is interested in testing the high level operations of the devices. For example, if the programmer wants to test a simple function, such as copying a file from one location to another, the number of signals which need to be controlled at the device I/O level may be very high. The programmer therefore needs a mechanism by which he can use a simple command or set of commands to achieve this finction instead of individually programming each bit signal. In other words, a level of abstraction is necessary to simplify the programmer's task.

This level of abstraction is provided by the interface subsystem. The interface subsystem translates test commands in a high-level language (e.g., C or C++) to the appropriate chip I/O level signals in HDL. As a result, the programmer is able to write tests in the high-level language. The test system can therefore take advantage of features such as object-oriented programming constructs, which are available in the high-level language, but not in the HDL. In one embodiment, CVI (described above) is employed as the interface system.

Figure 2:
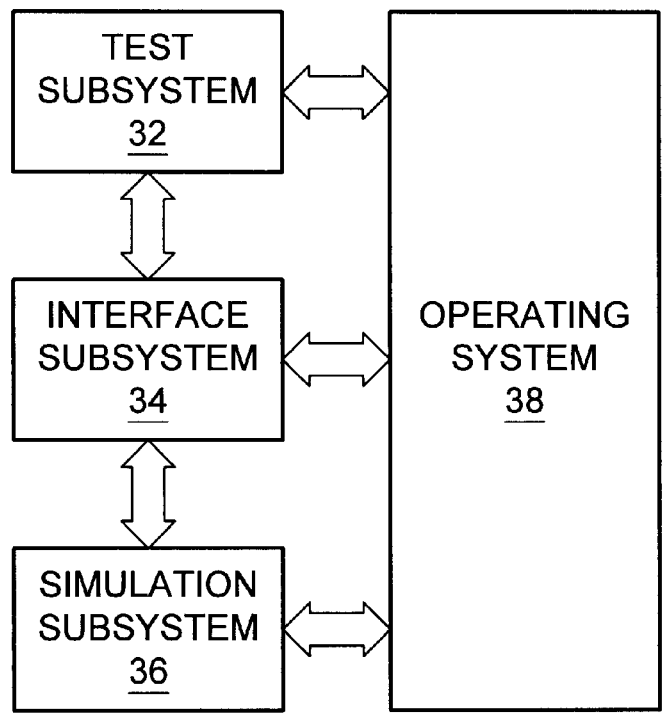
FIG. 2 is a block diagram of a design verification system in one embodiment of the invention.

As shown in FIG. 2, a block diagram of the design verification system, test subsystem 32, interface subsystem system 34 and hardware simulation subsystem 36 execute within the environment of operating system 38. The interface subsystem system 34 controls the interaction between the HDL based hardware simulation subsystem 36 and the C++ based test subsystem 32. The interface subsystem allows tests to be written using an object-oriented paradigm and provides the programmer with device objects which translate the tests into HDL bus signals.

Just as the interface subsystem adds a first level of abstraction between the test writer and the HDL test environment, the use of object-oriented programming principles in the test system allows additional levels of abstraction to be obtained within the test subsystem. For example, system level transactions may be defined to generate activity in several devices in response to a single system level function call. Object-oriented principles also provide benefits to the programmer such as the ability to re-use code and to hide data from the test subsystem writer.

The test subsystem controls each of the device functional objects in the simulated hardware system in order to verify the functionality of the design. The test subsystem utilizes device transaction objects to abstract away some of the details of the device operation. Configuration transaction objects likewise abstract away some of the details of transactions involving more than one functional device. The configuration transaction objects are derived from a system transaction class in order to group together convenience routines and make them available to the configuration transactions. Convenience routines are functions that simplify the process of managing test data and control sequences. The system transaction class also collects test flow control routines for use in simulation of the configuration transactions.

The system transaction class contains pointers to interface independent device transaction classes, and operations on device objects are performed through these pointers to maintain a consistent test interface. The interface independent device transaction classes are subclassed to map the transactions to the particular device designs currently used by the simulated hardware system. The interface independent device transaction subclasses are created as needed by the configuration transaction objects, and the interface independent device transaction subclasses in turn create the corresponding design-specific device transaction classes. This provides a simple, reliable and consistent means for setting up the interrelated objects and classes.

Figure 3:
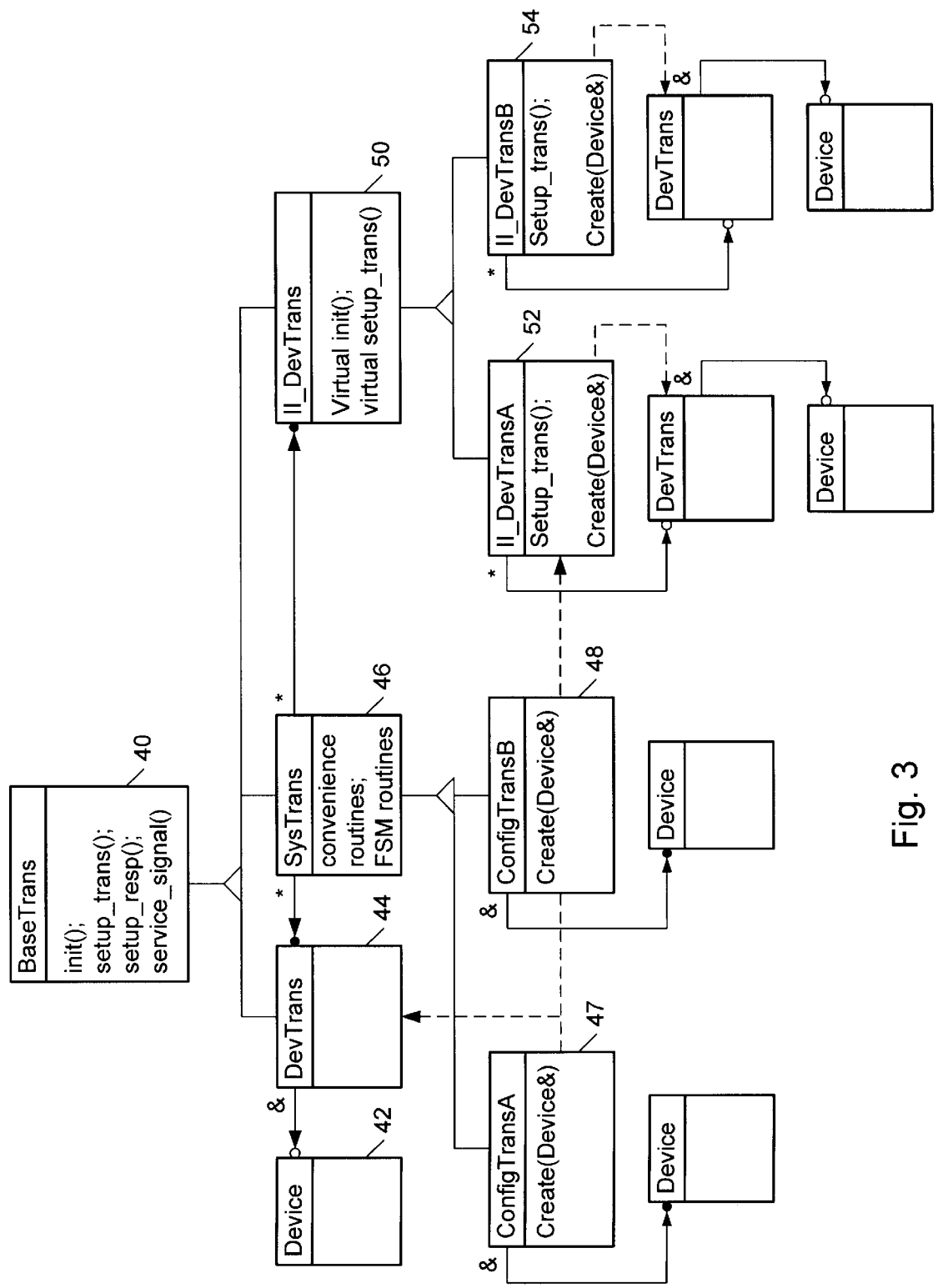
FIG. 3 is a diagram of a class structure implemented in a test subsystem in one embodiment of the invention.

Referring to FIG. 3, a diagram of a class structure used in one embodiment of the test system is shown. (In FIG. 3, a triangular shape on the line between the two classes indicates inheritance from the higher class.) Object references in the figure are indicated by an arrow with an accompanying ampersand (&). Pointers are indicated by an arrow with an accompanying asterisk (*). One-to-one relationships between objects and/or classes in the figure are indicated by an open circle at the head of the corresponding pointer or object reference arrow. A blackened circle indicates that there may be one or more pointers or object references. The dashed lines from the configuration transaction classes and interface independent device transaction classes to the device transaction classes indicate that the latter are created in the process of instantiating the former.

FIG. 3 shows a hierarchical class structure which has a base transaction class 40 at the top of the class hierarchy. Base transaction class 40 is an abstract class which is not directly instantiated. Instead, base transaction class 40 serves to provide a set of basic services which are common to all of the transactions. The services are provided through methods or functions which are declared in the base transaction class and are inherited by the classes which will be derived therefrom.

In this embodiment, base transaction class 40 includes several virtual functions which are common to all of the transaction classes in the hierarchy. The use of a common set of interface function names is necessary to take advantage of polymorphism, which is a useful feature of object-oriented programming languages. Polymorphism allows the programmer to create transaction objects and work with these objects in an abstract way while deferring to run time that task of figuring out which device is actually being used. Polymorphism provides several other advantages, including providing consistent high-level interfaces to similar objects, hiding from the programmer object information which he doesn't need to see and simplifying program code by encapsulating object-specific variations within the objects themselves.

In this embodiment, the functions declared by base transaction class 40 include the following: init( ); setup_trans( ); setup_resp( ); and service_signal( ). Init( ) initializes the device associated with the transaction class. Setup_trans( ) enables the associated device to drive transactions in the simulation. Setup_resp( ) controls how the associated device responds to transactions directed to it. Service_signal( ) is called to handle CVI signal messages sent from the HDL to the device.

A base device class (not shown in the figure) is used in the same manner as the base transaction class. One or more sub-classes can be derived from the base device class. The sub-classes inherit a common set of methods from the base device class and may define additional methods which are specific to the sub-classes. The base device class and its sub-classes enable the instantiation of the device objects which are shown in the figure. Through inheritance, the base device class provides a common interface to all of the bus functional models in the hardware simulation system.

Device transaction class 44 is derived from base transaction class 40. Device transaction class 44 therefore inherits the four methods listed above from base transaction class 40. In this embodiment, the methods declared in base transaction class 40 are virtual methods. That is, they are declared, but the implementation of each of the methods is not defined. It is left to the device transaction classes (e.g., device transaction class 44) to provide the program code which implements each of the methods.

Device transaction class 44 becomes associated with a single device object 42 through an object reference. Device transaction class 44 controls the transactions which device 42 executes. Because an object reference must always be satisfied, the use of an object reference to associate device 42 with device transaction class 44 forces the user to supply a device object when the device transaction class is instantiated. By forcing the user to supply the device object at instantiation, the possibility of changing the pointer or using a NULL pointer is eliminated and the compiler is allowed to perform static type checking. These properties make the object reference inherently safer to use than a standard C pointer. They add some complexity to the system, however, which will be discussed in more detail below.

Device transaction class 44 serves to hide the low-level details of the operation of device 42 from the test writer and thereby simplifies the communications between the test subsystem and the bus functional models of the hardware simulation subsystem. Device transaction class 44 also serves to maintain the state of device 42 between invocations of transactions involving the device. The test writer can set up high-level transaction information such as data, address, size and mode in the transaction class and then call a function such as setup_trans( ) to translate this information into individual register operations at the device level. Therefore, the test writer does not need to know which specific register operations are involved in performing a particular function call. Device transaction class 44 thus acts in a manner similar to that of a device driver while also enabling the compiler to perform static type checking.

In addition to enabling static type checking and providing a level of abstraction between device-level operations and the test writer, device transaction class 44 allows the test writer to define convenience methods associated with the device or device transaction. The test writer is free to define these test methods and any necessary instance variables, both of which may be encapsulated into the device transaction class.

Although the use of device classes and device transaction classes may considerably enhance the test writing environment, there remain some problems associated with multiple-device transactions which are not resolved simply by the use of these classes. For example, a test writer may want to develop convenience routines for transactions involving several devices. These convenience routines may manipulate data, affect the control flow of the simulation (e.g., advance the simulation time) or perform some other function. The convenience routines must, of course, be defined so that they have access to the appropriate devices.

The test writer might therefore create a system transaction class in which all of these convenience routines are defined. This would provide a grouping of common routines and would therefore potentially achieve the best re-use of program code, but might cause problems in terms of the desired use of object references. Because the test writer wants to have static type checking and wants to avoid NULL pointers, as explained above, the system transaction classes should use object references. The use of object references, however, requires that the associated device object be provided when the system transaction class and the object reference are instantiated. If the system transaction class contains convenience routines relating to all the devices in the design under test, any test which uses this system transaction class (i.e. any of the convenience routines in the class) must instantiate every device referenced in the class (i.e. all of the devices.) This would limit the performance of the system because tests would automatically reserve devices which would never be used for those tests. The unnecessary reservation of devices would also make it very difficult for tests to share device objects.

Another approach which might be taken by a test writer would be to define a configuration transaction class for every possible system configuration. In other words, a separate configuration transaction class would be written for each combination of devices which might be tested. Using this approach, only those devices which are involved in a transaction are instantiated for each test configuration. There is no unnecessary reservation of devices which are not used. The improved efficiency in the instantiation of device objects, however, is obtained at the expense of the efficient re-use of program code. Many of the configurations defined by the test writer would probably need very similar [access and] convenience routines, but these routines could not be collected in a single transaction class. Instead, the test writer would have to reproduce the code for particular routines in each of the transaction classes which uses the respective routines. Any code sharing could only be achieved by physically copying the routines from one transaction class to another. This would create more work for the test writer and would result in a program which is very difficult to maintain because each of the copies of a routine must be individually updated.

In one embodiment, the problems of the two approaches described above are overcome by using a combination of the different approaches. As described in the first approach, a system transaction class 46 is created as a subclass of base transaction class 40. System transaction class 46 is a collector of all the convenience routines which may be needed by the test writer. Because system transaction class 46 uses pointers to device objects instead of object references, it is not necessary to instantiate each device in the system for every test. The instantiation of device objects is left to the configuration transaction classes.

As shown in FIG. 3, the system transaction class 46 is sub-classed to create one or more configuration transaction classes 47, 48. The configuration transaction classes contain object references to each of the device objects which are involved in a transaction of the respective configuration. Configuration transaction classes 47, 48 are used to create the required device transaction classes (e.g., by including a method to create the device transaction classes in the constructors of the respective configuration transaction classes.) The device object references passed to the configuration transaction classes are used to set the device transaction class pointers inherited from the system transaction class, so the system transaction class' use of pointers is acceptable from a type checking perspective. This also prevents needless instantiation of devices in the system which are not used for a particular test. Further, the configuration transaction classes inherit all of the convenience routines from the system transaction class, so the programmer does not have to rewrite or copy the routines into each of the configuration transaction classes. This reduces the workload of the programmer and greatly increases the maintainability of the program code.

In order to allow for interface independent testing of the system design, the class structure of FIG. 3 also includes an interface independent device transaction class 50 which is subclassed from base transaction class 40. When the test system is configured to perform interface independent testing on the design, system transaction class 46 includes one or more pointers to interface independent device transaction classes 50. All operations on interface independent devices (i.e., those which have designs subject to change) are performed through the pointers to the corresponding interface independent device transaction classes.

There is a single interface independent device transaction class 50 for each of the devices which are subject to design changes. Interface independent device transaction class 50 presents a consistent interface to the device, regardless of the current state of the device's design. That is, the interface provided by this class remains the same whether the device design is in its final form or is simply a prototype design. Interface independent device transaction class 50 defines common interface routines and meta parameters which are used by the test code. The test writer is responsible for initializing the meta parameters and calling the common routines via the pointer to the interface independent device transaction class. Differences between designs in default parameters or routine implementations are hidden within the subclasses. Because the test code operates on interface independent device transaction class 50, the test code need not be changed (or may require only minimal changes, as explained below) to accommodate changes in the design of the device.

Changes in the device design are accommodated by the use of subclasses 52, 54 from interface independent device transaction class 50. (Classes 50 and 52/54 may be considered first-level and second-level interface independent transaction classes, respectively.) These classes inherit the interface routines and meta parameters from interface independent device transaction class 50 which is used by the test code. Classes 52 and 54 are each configured to be used with a single design of a particular device and provide mapping (in conjunction with the respective device transaction classes and device objects) from the interface of interface independent device transaction class 50 to that device design. As shown in FIG. 3, each of these classes is configured for use with a different design of a single device for which interface independent device transaction class 50 provides an interface. As indicated by the dashed line in FIG. 3, an interface independent device transaction subclass (e.g., 52) corresponding to a device which is subject to design changes is created by a configuration transaction class (e.g., 48) for a configuration which uses that device. Thus, when one design is substituted for another design of the same device, the only change which is required by the test code is in the line that creates the appropriate subclass of interface independent device transaction class 50. As described above, configuration transaction class 48 may include the create( ) method in its constructor, or this method may be explicitly called. The interface independent device transaction subclass in turn creates the appropriate device transaction class in the same manner.

Figure 4:
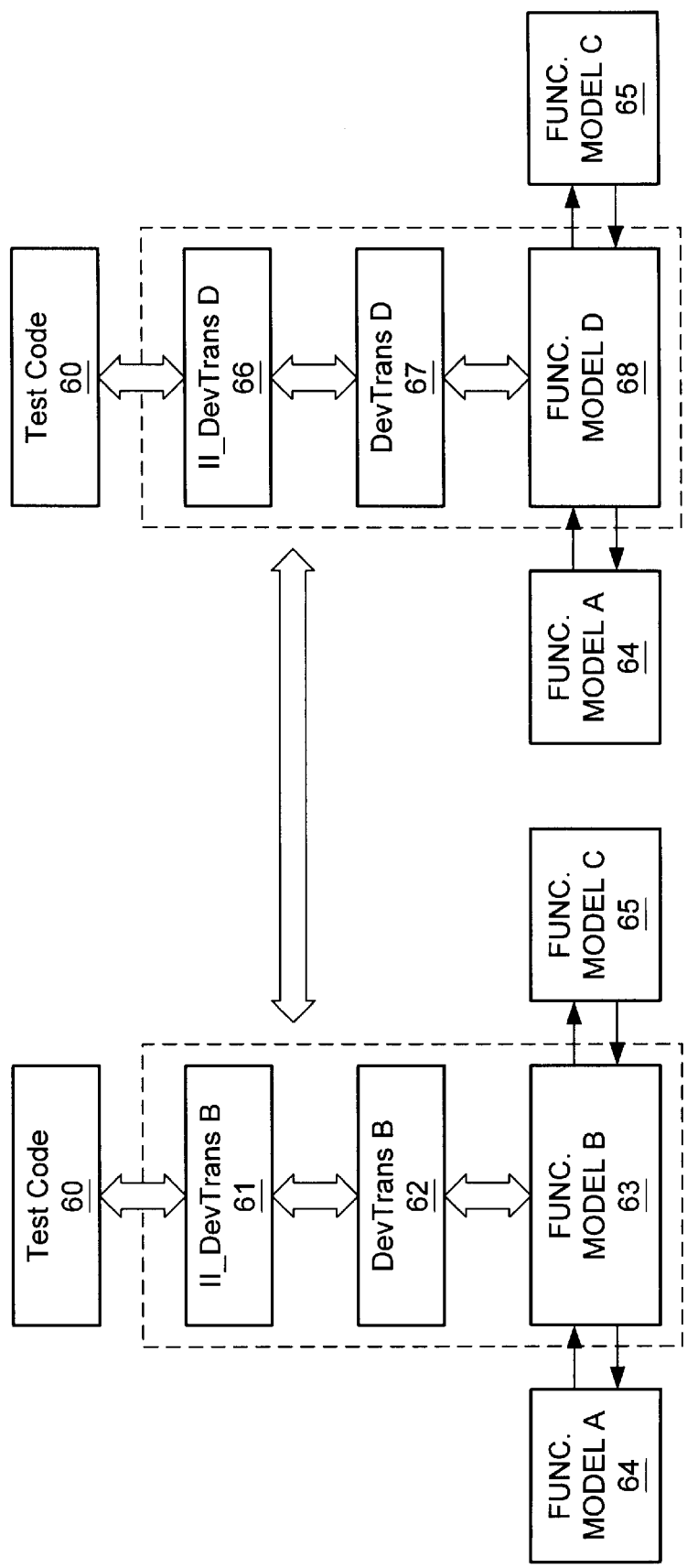
FIG. 4 is a block diagram illustrating the replacement of a first functional model and the corresponding device and transaction classes with another design and its corresponding classes in one embodiment of the invention.

Referring to FIG. 4, a block diagram illustrating the effect of circuit design changes on the design verification system is shown. The interface independent device transaction classes provide a means by which test code 60 can be written for a design which includes a prototype device 63 and then be reused without substantial alteration when the prototype device 63 is replaced with a subsequent design 68. (Test code 60 incorporates the interface independent device transaction class from which classes 61 and 66 are derived.) The only code changes which need to be made as a result of the design change are confined to those classes 61, 62 derived from the interface independent device transaction class. These are simply replaced with classes 66, 67 corresponding to the new design 68. (The arrow between the functional blocks for the "B" design and the "D" design indicate that they are interchangeable, and not that there is any functional interaction between them.) No changes need to be made to the body of the test code 60. Since most of the time and effort invested in the test system can be directed to the body of the test code 60, only a small portion of this investment is discarded when the old design is replaced with a new one.

One embodiment of the invention uses CVI as the interface subsystem. CVI uses an interrupt driven model for the test environment. An interrupt driven model allows the test to retain very tight control over execution in the simulation subsystem. The use of an interrupt driven model may, however, create difficulties for a test writer because he or she must be prepared to receive any type of interrupt at any point in the simulation—the test subsystem cannot only handle those types of interrupts which are of interest to the test writer. The use of the class hierarchy shown in FIG. 3 simplifies the program code required to implement an interrupt driven model and reduces the burden on the test writer by enabling a state driven style of test writing.

In a state driven style of test writing, the control flow of the tests are tied to a state sequencer (i.e., finite state machine, or FSM) in a manner resembling a hardware design style. The state sequencer may be defined in the base transaction class or in the system transaction class. The purpose of the state sequencer is to handle signals directed to the device based on the current state of the sequencer. This generally improves the readability of threads in the test subsystem because state information which is usually embedded in the program code is removed. This state information is moved into the device transaction class and stored in a format suitable for the state sequencer. The program code of the test subsystem can therefore be written as a simple stimulus generator. This greatly reduces the complexity of the code.

The state driven style of test writing may also simplify the writing of convenience routines. Using other styles of test writing, it may be necessary to include code in convenience methods which returns control to the simulation subsystem. In a state driven style, routines can return control to the simulation subsystem at a high level, allowing parallel operation without the need for multi-threading. This is a great benefit in a random testing environment.

In a system in which there is only one pending transaction and in which the transaction involves only two bus functional models there will be no random interaction of signals within the system. Thus, when a system is tested with only one transaction at a time, the testing cannot account for such random interactions and the possible effects of these interactions. Using a state driven style of testing, several transactions can be pending at once, allowing the random interaction of the transactions in much the same way as they would occur in the actual operation of the device under test. Because the test transactions are written as objects in a state driven test program, they may easily be performed in parallel to obtain the random interaction which cannot be obtained by the individual transactions.

While the present invention has been described with reference to particular embodiments, it will be understood that the embodiments are illustrative and that the invention scope is not limited to these embodiments. Many variations, modifications, additions and improvements to the embodiments described are possible. These variations, modifications, additions and improvements may fall within the scope of the invention as detailed within the following claims.

What is claimed is:

1. A method for verifying a hardware design comprising:

defining a plurality of functional models, wherein a first functional model represents a first design and wherein a second functional model represents a second design;

providing a body of test code configured to operate on the first and the second functional model using an interface defined by an interface independent device transaction class, wherein the interface is a same interface to both the first functional model and the second functional model;

providing a first subclass of said interface independent device transaction class, said first subclass containing a pointer to a first device transaction class, said first device transaction class containing an object reference to a first device object corresponding to the first functional model, wherein the first device transaction class provides stimuli indicative of signals in the hardware simulation model to the first device object, and wherein the first device transaction class and the first device object correspond to the first design;

performing one or more tests contained in said body of test code to verify said hardware simulation model containing said first functional model by operating on said first functional model through said interface defined in said interface independent device transaction class;

replacing said first functional model with said second functional model;

replacing said first subclass with a second subclass of said interface independent device transaction class, said second subclass containing a pointer to a second device transaction class, said second device transaction class containing an object reference to a second device object corresponding to said second functional model, wherein the second device transaction class and the second device object correspond to the second design; and performing said one or more tests contained in said body of test code to verify said hardware simulation model containing said second functional model by operating on said second functional model through said interface defined in said interface independent device transaction class.

2. The method of claim 1 further comprising providing a system transaction class which contains a pointer to said interface independent device transaction class, and wherein performing said one or more tests comprises performing operations on said pointer.

3. The method of claim 2 further comprising providing a configuration transaction class which is derived from said system transaction class, wherein said configuration transaction class inherits said pointer from said system transaction class and wherein said configuration transaction class creates said first subclass of said interface independent device transaction class.

4. The method of claim 3 wherein said first subclass of said interface independent device transaction class creates said first device transaction class.

5. The method of claim 2, further comprising providing a base transaction class from which said first device transaction class, said system transaction class, and said interface independent device transaction class are derived.

6. The method of claim 2 wherein said system transaction class contains a device transaction class pointer for each functional model in said hardware simulation system.

7. The method of claim 2 wherein said system transaction class contains one or more convenience methods, wherein a first portion of the convenience methods each correspond to interactions between multiple ones of the function models in the hardware simulation system.

8. The method of claim 1 wherein said interface independent device transaction classes contain one or more common interface routines and one or more meta parameters that are used by said test code.

9. The method of claim 8 wherein said base transaction class defines one or more methods for initializing objects instantiated from said configuration transaction class.

10. A system for verifying a hardware design comprising:
    means for providing a plurality of functional models, wherein a first functional model represents a first design and wherein a second functional model represents a second design;
    means for providing a body of test code configured to operate on the first and the second functional model using an interface defined by an interface independent device transaction class, wherein the interface is a same interface to both the first functional model and the second functional model;
    means for providing a first subclass of said interface independent device transaction class, said first subclass containing a pointer to a first device transaction class, said first device transaction class containing an object reference to a first device object corresponding to the first functional models, wherein the first device transaction class provides stimuli indicative of signals in the hardware simulation model to the first device object, and wherein the first device transaction class and the first device object correspond to the first design;
    means for performing one or more tests contained in said body of test code to verify said hardware simulation model containing said first functional model by operating on said first functional model through said interface defined in said interface independent device transaction class;
    means for replacing said first functional model with said second functional model;
    means for replacing said first subclass with a second subclass of said interface independent device transaction class, said second subclass containing a pointer to a second device transaction class, said second device transaction class containing an object reference to a second device object corresponding to said second functional models, wherein the second device transaction class and the second device object correspond to the second design; and
    means for performing said one or more tests contained in said body of test code to verify said hardware simulation model containing said second functional model by operating on said second functional model through said interface defined in said interface independent device transaction class.

11. The system of claim 10 further comprising means for providing a system transaction class which contains a pointer to said interface independent device transaction class, and wherein performing said one or more tests comprises performing operations on said pointer.

12. The system of claim 11 further comprising means for providing a configuration transaction class which is derived from said system transaction class, wherein said configuration transaction class inherits said pointer from said system transaction class and wherein said configuration transaction class creates said first subclass of said interface independent device transaction class.

13. The system of claim 12 wherein said first subclass of said interface independent device transaction class creates said first device transaction class.

14. The system of claim 11, further comprising means for providing a base transaction class from which said first device transaction class, said system transaction class, and said interface independent device transaction class are derived.

15. The system of claim 11 wherein said system transaction class contains a device transaction class pointer for each functional model in said hardware simulation system.

16. The system of claim 11 wherein said system transaction class contains one or more convenience methods, wherein a first portion of the convenience methods each correspond to interactions between multiple ones of the function models in the hardware simulation systems.

17. The system of claim 10 wherein said interface independent device transaction classes contain one or more common interface routines and one or more meta parameters that are used by said test code.

18. The system of claim 17 wherein said base transaction class defines one or more methods for initializing objects instantiated from said configuration transaction class.

* * * * *

UNITED STATES PATENT AND TRADEMARK OFFICE
CERTIFICATE OF CORRECTION

PATENT NO.    : 6,421,634 B1
DATED         : July 16, 2002
INVENTOR(S)   : Dearth et al.

It is certified that error appears in the above-identified patent and that said Letters Patent is hereby corrected as shown below:

<u>Column 14,</u>
Line 52, please change "systems" to -- system --.

Signed and Sealed this

Sixth Day of May, 2003

JAMES E. ROGAN
*Director of the United States Patent and Trademark Office*